(12) United States Patent
Bachrach et al.

(10) Patent No.: US 6,699,356 B2
(45) Date of Patent: Mar. 2, 2004

(54) METHOD AND APPARATUS FOR CHEMICAL-MECHANICAL JET ETCHING OF SEMICONDUCTOR STRUCTURES

(75) Inventors: Robert Z. Bachrach, Burlingame, CA (US); Jeffrey D. Chinn, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 47 days.

(21) Appl. No.: 09/932,396

(22) Filed: Aug. 17, 2001

(65) Prior Publication Data

US 2003/0038110 A1 Feb. 27, 2003

(51) Int. Cl.$^7$ .............................................. B05C 5/00
(52) U.S. Cl. ............................ 156/345.21; 156/345.11
(58) Field of Search .................. 156/345.11, 345.17, 156/345.21, 345.18, 345.33, 345.55, 345.29

(56) References Cited

U.S. PATENT DOCUMENTS

| | | | | |
|---|---|---|---|---|
| 4,344,809 | A | | 8/1982 | Wensink ...................... 156/345 |
| 4,384,917 | A | | 5/1983 | Wensink ...................... 156/627 |
| 4,497,692 | A | | 2/1985 | Gelchinski et al. ............ 204/15 |
| 4,973,379 | A | | 11/1990 | Brock et al. ................. 156/640 |
| 5,041,229 | A | | 8/1991 | Brock et al. ................. 252/79.1 |
| 5,378,307 | A | * | 1/1995 | Bard et al. ..................... 216/91 |
| 5,464,509 | A | | 11/1995 | Mlcak et al. .............. 204/129.3 |
| 5,679,212 | A | * | 10/1997 | Kato et al. ................... 438/692 |
| 5,681,448 | A | | 10/1997 | Uchiyama et al. ........... 205/656 |
| 5,770,096 | A | | 6/1998 | Lee ................................ 216/41 |
| 5,795,826 | A | | 8/1998 | Gambino et al. ............ 438/692 |
| 6,179,954 | B1 | * | 1/2001 | Kawana et al. ......... 156/345.21 |
| 6,264,789 | B1 | * | 7/2001 | Pandey et al. .......... 156/345.12 |
| 6,284,092 | B1 | * | 9/2001 | Manfredi ................ 156/345.12 |

FOREIGN PATENT DOCUMENTS

| | | | | |
|---|---|---|---|---|
| DE | 259062 | A | 8/1988 | .......... H01L/21/306 |
| DE | 3942447 | A | 6/1991 | ............ F16D/65/84 |
| JP | 61283366 | A | 12/1986 | .............. B05B/1/02 |
| KR | 9001404 | B | 3/1990 | ............ H01L/31/12 |
| SU | 907501 | B | 2/1982 | .............. G03F/7/02 |
| SU | 1062311 | A | 12/1983 | ............. C23G/5/00 |
| SU | 1340192 | A | 11/1987 | ........... C25D/21/12 |
| SU | 1356521 | A | 3/1990 | |
| SU | 1622427 | A | 1/1991 | ........... C25D/19/00 |
| WO | WO00/72367 | | 11/2000 | .......... H01L/21/302 |

OTHER PUBLICATIONS

Research Disclosure No. RD 317105 (Anonymous). Published Sep. 10, 1990, "One–Step Mask Making." Derwent WPI (Dialog®) File 351, Acc. No. 1990–310819/199041.

* cited by examiner

Primary Examiner—Gregory Mills
Assistant Examiner—Sylvia R. MacArthur
(74) Attorney, Agent, or Firm—Shirley L. Church; Barton A. Smith

(57) ABSTRACT

A chemical-mechanical jet etching method rapidly removes large amounts of material in wafer thinning, or produces large-scale features on a silicon wafer, gallium arsenide substrate, or similar flat semiconductor workpiece, at etch rates in the range of 10–100 microns of workpiece thickness per minute. A nozzle or array of nozzles, optionally including a dual-orifice nozzle, delivers a high-pressure jet of machining etchant fluid to the surface of the workpiece. The machining etchant comprises a liquid or gas, carrying particulate material. The liquid may be a chemical etchant, or a solvent for a chemical etchant, if desired. The areas which are not to be etched may be shielded from the jet by a patterned mask, or the jet may be directed at areas from which material is to be removed, as in wafer thinning or direct writing, depending on the size of the desired feature or etched area.

17 Claims, 2 Drawing Sheets

METHOD AND APPARATUS FOR CHEMICAL-MECHANICAL JET ETCHING OF SEMICONDUCTOR STRUCTURES

BACKGROUND OF THE INVENTION

1. Field of the Invention

This invention relates to a method and an apparatus for achieving chemical-mechanical jet etching of features in a workpiece such as a semiconductor substrate or a built-up stack of films. In particular, the invention permits high etch rates for thinning the workpiece or for production of relatively large dimension etched features in such a workpiece, such as trenches and through-wafer vias for electrical contacts, or reservoirs for ink-jet heads, where critical dimensions are relatively large, on the order of 1–100 microns, or for thinning in the range of 100–1000 microns.

2. Brief Description of the Background Art

Various wet-chemical etching, dry-etching (i e., various forms of plasma etching) and electrochemical methods exist which permit creation of features on a semiconductor substrate or on a stack of layers of semiconductor, conductor, and dielectric materials, or similar flat structure, generally using various sorts of patterned masks to control where underlying material is etched away and where it is left in place. Such methods provide the required degree of precision for etching semiconductor features with critical dimensions in the submicron range, but typically achieve etch rates in the range of about 1 micron or less of thickness per minute. Where the required features are relatively large-scale, in the range of from about 10 to about 100 microns, as in making a through-wafer via or large trench on a silicon wafer, or the amount of material to be removed is large, as in wafer thinning applications, and the required precision is less critical, the etch rates achievable by such methods are generally too low to be practical in commercial production. What is needed is a method permitting the removal of large amounts of silicon wafer or other material, with moderate precision, at etch rates sufficiently rapid to be practical in industrial semiconductor processing.

SUMMARY OF THE INVENTION

We have invented a chemical-mechanical jet etching method which is capable of quickly and accurately removing large amounts of material from a workpiece in wafer thinning applications, and is capable of rapidly producing large-scale features, with critical dimensions on the order of 1–100 microns, and aspect ratios (defined as the ratio of the depth of an etched feature to the maximum diameter of a via, or the maximum width of a trench, at the entrance) in the range of 1:1 to 10:1. The method of the invention can be carried out on a generally flat semiconductor workpiece, including but not limited to a silicon wafer or gallium arsenide or other semiconductor substrate, silicon-on-insulator ("SOI"), $SiO_2$, glass, quartz, pyrex, ceramic, or glass bonded to a substrate, conductor, or insulator. In particular, the method is expected to function very advantageously when applied to silicon wafer, gallium arsenide, and SOI substrates, In both thinning and feature creation applications, etch rates of at least about 10–100 microns of substrate thickness per minute can be achieved.

The method uses an ejector, typically a nozzle or array of nozzles, to deliver a jet, a high-pressure stream of a fluid etchant medium, referred to in this application as the "machining etchant," to the surface of a workpiece. Material is thereby machined from the surface, at a rate as high as about 100 microns of depth per minute, in areas of the substrate upon which the jet impinges. The areas which are not to be etched may be shielded from the jet by a patterned mask, or the jet may simply be directed at those specific areas from which material is to be removed, depending on the size of the desired feature or etching area. As described above, the desired features may be on a workpiece such as a silicon wafer, $SiO_2$, gallium arsenide substrate, or silicon-on-insulator substrate. For example, and not by way of limitation, machined features created on a semiconductor substrate wafer may include a through-wafer via for making an electrical connection from one surface of the wafer to the other, or a large trench of the kind used in formation of conductor lines which run across a surface of the wafer, or other three-dimensional shape to be created on the workpiece. The method may also be used to remove material from the surface of a workpiece which is to be thinned to a smaller thickness.

The apparatus used to carry out the method may provide for the use of a single ejector, generally a nozzle or an array of nozzles. Each nozzle may be a single nozzle, or a dual nozzle, designed to deliver a compound jet of machining etchant to the workpiece The nozzle or nozzles may be stationary or movable. The workpiece may likewise be stationary or movable. The workpiece may be rastered, rotated, or translated at an angle with respect to a stationary nozzle or nozzles, or the nozzles moved with respect to a stationary workpiece, or both may be moved.

The machining etchant used to carry out the invention may be a chemically inert liquid, which merely acts to bombard the surface, or a liquid solution of a typical chemical etchant, which bombards but also chemically reacts with the surface. The machining etchant may be a slurry, including a suspension or dispersion, of abrasive or other solid particles in a liquid or a gas medium. The slurry may include a chemical etchant, or may rely solely on the presence of solid particles to provide physical bombardment. The chemical etchant, if used, may be a liquid, or it may be a solution of an etchant compound dissolved in the liquid component of the slurry, or it may be some or all of the solid particle component of the slurry. In the case of the suspension or slurry, the particulates present in the machining etchant can be of any appropriate chemical composition, particle size, particle size distribution, or shape. The machining etchant may also be a dry powder, used for physical bombardment and/or chemical reactivity, and carried by a high-pressure gas stream.

Jet etching can be done by direct-writing to the surface to be etched, or using a mask, patterned so as to permit impingement of the etchant only in those areas of the workpiece where material is to be removed. The mask, if any, covering that portion of the workpiece surface where no etching is desired may be a photoresist mask, an inorganic hard mask, or other protective mask. Following jet etching, the mask may be removed, if desired, using an appropriate solvent and/or dry etch process, as applicable, to remove residual mask material.

In one exemplary embodiment of the invention, the workpiece is a silicon or other semiconductor substrate wafer. The machining etchant is a slurry of abrasive or physical bombardment particulate material, carried in a liquid, which may also be a chemical etchant or solution of a chemical etchant. The particulates may be selected from among the following materials: fumed silica, cerium oxide, alumina, diamond, green or black silicon carbide, boron cagernet, or other similar fine-grained hard materials. Specific materials are expected to be particularly suitable for use with specific workpiece compositions, as is known to persons skilled in the semiconductor art. The liquid may be selected from among the following materials: Water can be used where minimal or no chemical component, but only mechanical etching, is desired. The chemical etchants that may be used as the slurry liquid are selected from among solutions of the following materials: KOH, NaOH, HF, HNA (an aqueous solution of about 7 wt % HF, about 30 wt. % $HNO_3$, and about 10 wt. % $CH_3COOH$), TMAH (tetramethyl ammonium hydroxide), EDP (ethylene diamine pyrochatechol), and amine gallates. Again, specific etchants are expected to be particularly suitable for carrying out the invention on specific workpiece compositions, as known to persons skilled in the semiconductor art. In this embodiment, the nozzles are stationary, and are arrayed across a diameter or a radius of the (usually circular) workpiece wafer. A mask is applied over the surface of the workpiece wafer, and the wafer is rotated beneath (or above) the nozzle array such that the machining etchant impinges upon non-masked areas on the wafer surface facing the nozzles during each rotation of the wafer. Various methods may be used to detect when the silicon wafer material in the non-masked areas has been removed to the desired depth of a trench or other feature on the wafer surface, or when a desired hole has been etched all the way through the wafer in order, for example, to create a via extending from one surface of the wafer through to the other.

DETAILED DESCRIPTION OF THE INVENTION

I. Definitions

As a preface to the detailed description, it should be noted that, as used in this specification and the appended claims, the singular forms "a", "an", and "the" include plural referents, unless the context clearly dictates otherwise.

Specific terminology of particular importance to the description of the present invention is discussed throughout the application.

II. Apparatus for Practicing the Invention

Figure 1:
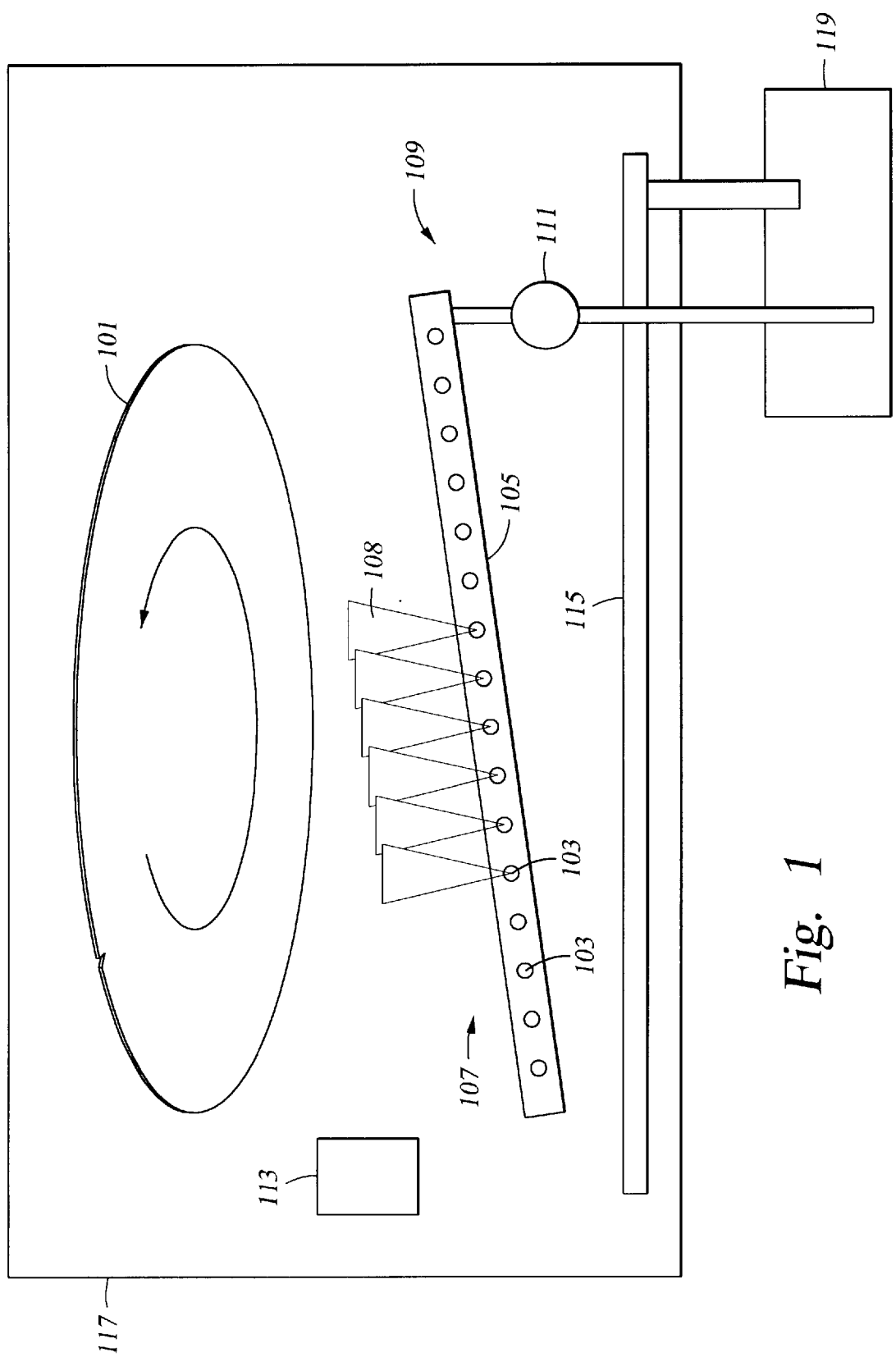
FIG. 1 presents a schematic drawing of an example apparatus for performing the present invention's Chemical-Mechanical Jet Etching method upon a silicon wafer or other relatively flat semiconductor structure.

FIG. 1 illustrates the general design of an apparatus capable of carrying out the method of the invention. In operation, a silicon wafer or other workpiece (not shown) is affixed to workpiece holder 101, which is capable of rotating, rastering, and/or translating the workpiece. An etchant delivery system 109 carries a machining etchant (not shown), pressurized by a machining etchant pump 111, from a machining etchant reservoir 119, through an injector bar 105, to an array 107 of high pressure nozzles 103. High pressure jets 108 of the machining etchant issue from the nozzles and impinge on the surface of the workpiece, which is moving past the nozzles, etching away workpiece material where the jets strike the surface. The jet etching process is carried on in a closed, temperature- and pressure-controlled process chamber 117, which confines the effluent machining etchant. Operating nozzle pressures of the machining etchant will range from about 100 to about 10,000 psia, depending upon the composition of the machining etchant and the size of the jet orifice (the higher the machining etchant viscosity and the smaller the jet orifice, the higher the required nozzle pressure). Typically, the nozzle pressure will range from about 100 to about 1000 psia for most direct writing (maskless etching) operations, and from about 100 to about 500 psia for jet etching using a mask.

If desired, the effluent etchant, which now carries the material etched off the workpiece, can be returned, via a machining etchant collection and recycling system 115, to the machining etchant reservoir 119, for recycling through the system. Meanwhile, an endpoint detection system 113 can determine when the desired amount of material has been removed from the workpiece, and either terminate the jet etching process automatically, or provide information permitting an operator to do so manually.

In other variants of the apparatus, only a single machining etchant nozzle 103 may be used. In yet other variants, the nozzle 103 or nozzle array 107 may move in addition to, or rather than, the workpiece holder 101, to produce the desired rotation, translation, rastering, or other relative movement between the nozzles 103 and the workpiece.

Figure 2:
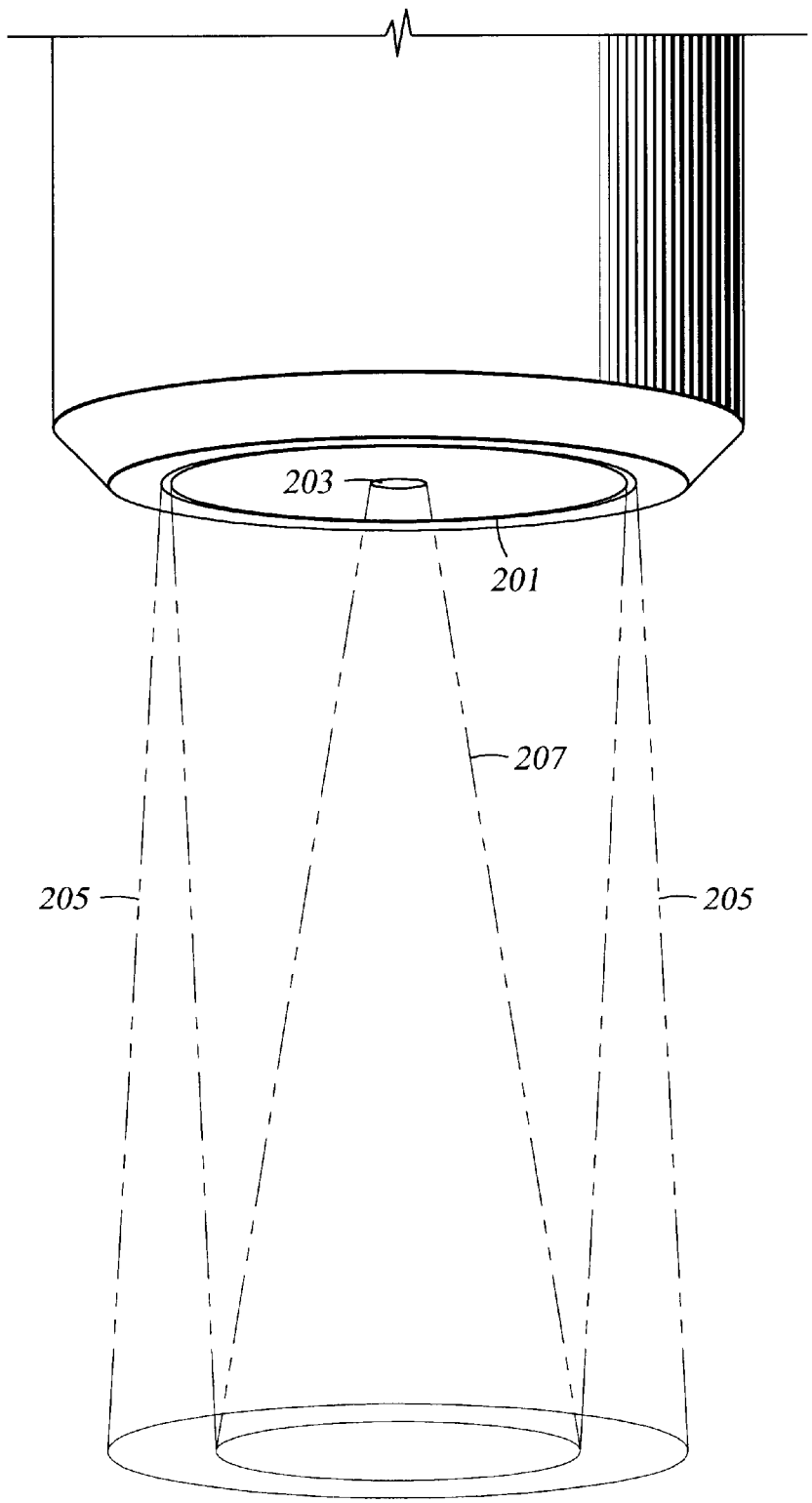
FIG. 2 represents a schematic drawing of a dual nozzle, a nozzle-within-a-nozzle, which can be used for delivery of machining etchant, as described herein.

In another variation, the high pressure machining etchant nozzle 103 may be designed as a dual nozzle, or nozzle-within-a-nozzle (see FIG. 2), in which a concentric annular outer orifice 201 surrounds a central orifice 203, and discharges a secondary high-pressure flow of fluid 205, forming a spray curtain surrounding and containing the jet cone 207 from the central orifice, thereby creating a more narrowly focused jet. In addition, if each orifice of the dual nozzle has an independently operable machining etchant delivery system 109 (in FIG. 1), the dual nozzle may also be used to simultaneously deliver a machining etchant of one composition and pressure from the central orifice and a second machining etchant of a different composition and/or pressure from the annular orifice, permitting adjustment of a resultant jet pattern, as well as simultaneous or phased delivery jets of machining etchants with differing physical and/or chemical properties from the two orifices, including, without limitation, jets of different viscosities, densities, volatilities, temperatures, inert liquid or carrier gas compositions, compositions of liquid chemical etchants and dissolved etchants, and compositions and concentrations of particulate materials, including particle shapes, hardnesses, particle size ranges and size distributions, colors, conductivities, and chemical reactivities. In particular, in one advantageous embodiment of the dual nozzle, the pressures and viscosities of the inner jet and the outer, annular jet, may be selected such as to produce a distinct inner core and a higher viscosity annular cladding jet, which confines the core jet, so as to achieve a very narrow, powerful jet for, e.g., fluid jet drilling or trenching operations. When a dual nozzle is used to simultaneously deliver two different machining etchants, it will generally not be appropriate to recycle the effluent machining etchant. The dual nozzle (or a standard nozzle) may also be constructed so as to permit an electrical bias potential to be applied between the jet nozzle and the workpiece, further enhancing the etching by electrochemical reaction, with the inclusion of a suitable electrolyte in the machining etchant stream.

In addition, a regulating mechanism, not shown but associated with the machining etchant delivery system 109, may be provided to deliver the machining etchant to all or selected nozzles, or to either or both of the orifices of a dual nozzle, in such a manner as to cause the pressure and/or flow rate delivered by the nozzle or orifice to vary while in operation, either continuously or in pulsed fashion. This will permit, for example, on-the-fly transitions between different machining etchant compositions, or delivery to the substrate surface of pulses of machining etchant in order to better remove and clear away the effluent machining etchant, carrying etched workpiece material, from the contact points at which jet etching is taking place.

EXAMPLES

Several examples of various embodiments of the invention are presented below, illustrating particular features of the invention which are helpful for particular applications of the invention.

Example 1

Thinning

In a first embodiment of the invention, a silicon wafer, other semiconductor substrate, or other workpiece, is uniformly thinned by using the apparatus shown in FIG. 1.

A workpiece (not shown) is affixed to the workpiece holder 101, and the holder 101 rotates the workpiece beneath the injector bar 105, with its array 107 of high-pressure nozzles 103. A machining etchant, in the form of a slurry or suspension of appropriate particulate material in a chemical etchant/solvent, in a concentration in the range of from about zero to about 95 weight percent, is pumped by pump 111 through delivery system 109 to nozzle array 107 on injector bar 105, at a nozzle pressure in the range of about 7 to about 70 $Kg/cm^2$. Nozzles 103 then deliver the machining etchant 108 as a high-pressure jet which impinges upon the workpiece wafer as the holder 101 and workpiece rotate past the nozzles 103 at a speed ranging from about 100 to about 2000 RPM.

The angle at which the machining etchant 108 impinges on the workpiece surface (not shown) should be in the range of between about 5° and about 15° from perpendicular to the etched surface, in that it must be close enough to perpendicular to avoid dissipating the force of the spray, whereas an angled surface impingement may facilitate the clearing away of the sprayed machine etchant 108 and entrained etched material from the workpiece surface. So long as an appropriate relative position between the workpiece surface and nozzle array 107 is maintained, operation of the entire assembly in an inverted position, with the workpiece rotating above rather than beneath the nozzle array 107, or indeed at any convenient orientation of the workpiece, is acceptable.

In this embodiment, no mask is applied to the surface of the workpiece. Instead, the number, angle spread, and overlapping of the nozzles' 103 spray patterns are adjusted to deliver, as nearly as possible, equal spray fluxes at all points on the workpiece, so that the surface of the workpiece is uniformly machined (thinned) to the desired thickness. Etch rates as high as about 100 microns of depth per minute are achievable.

The effluent machining etchant slurry, with removed workpiece material carried in it, is transported within the process chamber 117, and collected in an effluent slurry collector 115, from which it is optionally transported to a slurry tank 119, and recycled through the system until it is determined to be chemically exhausted, physically degraded, or loaded with removed material such that it should be discarded. The effluent machining etchant may be recycled until it will no longer etch effectively, and then replaced altogether, or it may be replenished by the periodic or automated addition, to the slurry tank, of fresh chemical etchant, and/or new particulate material, either during continuing etching operations, or after an appropriate number of etching runs. Note, recycling of machining etchant would typically not be done where jet etching is carried out using different machining etchants from the inner and outer orifices of the dual nozzle design described earlier.

Typical ranges of process conditions for this embodiment of the method of the invention are presented in Table I, below.

TABLE 1

Typical Process Condition Ranges for Chemical-Mechanical Jet Etching of a Semiconductor Workpiece

| Process Variable | Range of Process Variable in Jet Etching Operation |
| --- | --- |
| Machining Etchant Flow Rate (sccm) | About 0.1 to about 10 |
| Machining Etchant Pressure (Psia) | About 100 to about 10,000; about 100 to about 1000 for direct writing applications; about 100 to about 500 for masked jet etching. |
| Identity of Liquid in Machining Etchant | Dependent on workpiece being etched |
| Identity of Chemical Etchant in Machining Etchant | Dependent on workpiece being etched, but typically KOH for a silicon substrate |
| Chemical Etchant Concentration in Machining Etchant (Wt. Percent) | Dependent on workpiece being etched, but typically about 33% KOH in water for a silicon substrate |
| Identity of Particulate Material in Machining Etchant | Dependent on workpiece being etched, but typically $SiO_2$ for silicon substrate |
| Particulate Concentration in Machining Etchant (Wt. percent) | About 10 to about 75 |
| Machining Etchant Temperature (° C.) | about zero to about 80 |
| Workpiece Temperature (° C.) | About zero to about 100 |
| Process Chamber Temperature (° C.) | About 20 to about 80 |
| Process Chamber Pressure (Atm. Absolute) | About 0.1 to about 1.1 |

Example 2

Patterning

A second embodiment of the invention uses the same the general apparatus as is illustrated by FIG. 1, and operation as described in Example 1, but utilizes a patterned mask applied to the surface of the semiconductor workpiece to permit selective etching of a surface of that workpiece. Relatively large-scale features, such as trenches and vias with critical dimensions in the range of from about 5 to several hundred microns, and depths of up to the full thickness of the workpiece wafer, can be readily produced in this way, again at etch rates as high as about 100 microns of depth per minute. Typical process conditions for this embodiment of the method of the invention are also as presented in Table I, above.

The patterned mask may consist of either a conventional organic photoresist, or a glasslike silane material, or an inorganic hard mask, such as silicon oxide or silicon nitride, which are generally known in the art.

This chemical-mechanical jet etch method is inherently anisotropic. If, as is usually the case, a vertical feature sidewall is desired on the features being etched, the angle between the discharge direction of the high-pressure nozzles 103 and the workpiece surface must be more perpendicular than in wafer thinning operations, to avoid getting either tapered or undercut feature profiles.

If the method is used to etch vias, up to and including through-wafer ones, either perpendicular holes or holes angled up to about 15° from perpendicular to the wafer surface are possible with appropriate selection of angle of machining etchant impingement. Pulsed delivery of machining etchant may be used to avoid buildup of etched material in the bottom of the hole, or stagnation of the etchant in the hole, preventing the entry of fresh machining etchant.

Following completion of etching of the desired features, the patterned mask can, depending on the application, either be left in place, or be stripped off the wafer by use of an appropriate solvent, for an organic mask material, or by a wet- or dry-etch step with an appropriate etchant, selected to avoid or minimize attack on the etched features, for a hard mask.

Example 3

Maskless Jet Etching.

A third embodiment of the invention again uses the basic apparatus illustrated in FIG. 1, but, as in the wafer thinning operations described in Example 1, uses no mask. Instead, in this embodiment, intended for making multiple vias in or through a silicon wafer or other semiconductor workpiece, the workpiece is held stationary, and a narrow stream of machining etchant is directed, from a single narrowly-focused nozzle, at each desired via location, serially with one nozzle or concurrently with multiple nozzles, until the desired etch depth is achieved. Pulsed delivery of machining etchant, as described above, may be advantageous to avoid buildup of machining etchant loaded with etched material, or stagnation of the etchant, in the hole. Process conditions are again generally those shown in Table 1. Features in the size range of about $10\mu$ or larger can be direct-written in this way.

The narrowly-focused machining etchant stream of this embodiment may be better achieved by utilizing a dual nozzle, or "nozzle within a nozzle" design, described above and shown in FIG. 2, wherein an outer annular orifice surrounds a central orifice in each spray nozzle, producing a curtain of etchant from the annular orifice that acts to restrain and focus the jet from the interior orifice in a tighter pattern, maintaining better control over the diameter of the hole etched in the workpiece by the jet from that nozzle. Such a nozzle will also permit "on the fly" transitions in the aggregate composition of the machining etchant, changing, for example, to a greater or lesser solids concentration, solids particle size distribution, or chemical etchant concentration, as discussed previously, while etching continues, by permitting feeding different machining etchant compositions to the central and to the annular nozzle orifices.

Example 4

Trenching

Another embodiment of the invention, rather than using a mask and impinging machining etchant on the entire surface of the workpiece to be etched, uses no mask, but instead uses the narrowly-focused nozzle design discussed in Example 3 to permit accurately-located removal of material by each nozzle, and moves either the nozzles 103 or the workpiece holder 101, or both, during etching, such that their relative movement causes trenches to be etched wherever the machining etchant impinges on the workpiece. In particular, if either the workpiece holder 101 or the nozzles 103 is rastered with respect to the other, parallel and/or perpendicular trenches of a desired depth can be achieved by controlling the speed and direction of the relative movement of the nozzles 103 and the workpiece holder 101, and the volume and composition of the machining etchant delivered. Again, pulsed delivery of machining etchant may be helpful in avoiding buildup of sprayed machining etchant and etched workpiece material.

Example 5

Liquid Jet Etching

In another embodiment of the invention, no solid particulates are incorporated in the machining etchant, which may comprise a chemical etchant, which may itself be a liquid or a solute. Where the concentration of a chemical etchant material in the fluid is zero, the fluid, delivered to the workpiece surface at high pressure and velocity, serves merely as a bombarding agent. Increasing concentrations of chemical etchant materials in the machining etchant will increasingly contribute chemical etching of the surface as well. The use of a mask to protect areas of the workpiece where etching is not desired will be important, since, where the bulk of the etching is being done by chemical and not mechanical action, the chemical reaction will otherwise continue wherever chemical etchant remains in contact with the workpiece surface. However, as the etching is increasingly accomplished by chemical attack on the workpiece rather than by physical impingement upon it, the etching action will be much more isotropic, so the use of a mask may be much less effective in preventing undercutting in the sidewalls of the etched features.

Example 6

Dry Etching

In another embodiment of the invention, no liquid chemical etchant or solvent is used. Instead, the particulate etching medium is carried on a high-velocity gas stream. The basic apparatus remains as illustrated in FIG. 1, but the machining etchant is a dry powder, which impinges on the workpiece at high velocity. Generally, such etching will involve no chemical reaction with the surface, though it is possible to select particulate species which chemically react with the workpiece surface when brought into intimate contact with it. Modes described above, either with or without the protective mask, are equally applicable with dry powder etch. Typical process conditions will differ from those used with the liquid slurries or suspensions, and are presented in Table 2, following.

TABLE 2

Typical Process Conditions for Chemical-Mechanical Jet Etching of a Semiconductor Structure, Utilizing a Dry Powder Machining Etchant

| Process Variable | Range of Process Variable in Jet Etching Operation |
|---|---|
| Machining Etchant Flow Rate (sccm) | About 0.1 to about 10 |
| Machining Etchant Pressure (Psia) | about 100 to about 10,000; more typically about 100 to about 1000 |
| Identity of Machining Etchant Carrier Gas | Typically $N_2$ or air |
| Identity of Machining Etchant Particulate Material | Dependent on workpiece composition, but typically $SiO_2$ for a silicon substrate |

TABLE 2-continued

Typical Process Conditions for Chemical-Mechanical Jet Etching of a Semiconductor Structure, Utilizing a Dry Powder Machining Etchant

| Process Variable | Range of Process Variable in Jet Etching Operation |
| --- | --- |
| Particulate Concentration in Machining Etchant (Vol. percent) | About 80 to about 90 |
| Machining Etchant Temperature (° C.) | About 0 to about 80 |
| Workpiece Temperature (° C.) | About 0 to about 100 |
| Process Chamber Temperature (° C.) | About 20 to about 80 |
| Process Chamber Pressure (Atm. Absolute) | About 0.1 to about 1.1 |

The above described preferred embodiments are not intended to limit the scope of the present invention, as one skilled in the art can, in view of the present disclosure, expand such embodiments to correspond with the subject matter of the invention claimed below.

We claim:

1. An apparatus which is capable of performing jet etching on semiconductor workpieces, said apparatus comprising:

a) at least one ejector device which is adapted to project a machining etchant fluid including particulates, which fluid machines by surface bombardment or by a combination of chemical reaction and surface bombardment onto a surface of a semiconductor workpiece, whereby material is etched from said workpiece surface, wherein said at least one ejector device is oriented with respect to said workpiece surface;

b) a holding device which is adapted to secure said workpiece in said oriented position relative to said ejector device while said workpiece surface is being etched and c) a delivery system which is adapted to deliver said machining etchant fluid to said at least one ejector device.

2. The apparatus of claim 1, wherein said at least one ejector device is an array of ejector devices.

3. The apparatus of claim 2, wherein said ejector device comprises a spray nozzle.

4. The apparatus of claim 1, wherein a selection of pressures and viscosities of a first machining etchant supplied to the central orifice and a second machining etchant supplied to the annular orifice of said at least one dual nozzle, results in distinct inner and outer jets, whereby the outer jet confines the inner jet to a narrower dimension than would occur in the absence of the outer jet.

5. The apparatus of claim 1, wherein said holding device comprises a moving mechanism whereby said workpiece is translated and/or rastered with respect to the ejector device during said jet etching.

6. An apparatus which is capable of performing jet etching on semiconductor workpieces, said apparatus comprising:

a) at least one ejector device comprising at least one dual nozzle, in which a central orifice for discharge of machining etchant is surrounded by an outer, annular orifice through which machining etchant is also discharged during said jet etching of said semiconductor workpiece, which at least one ejector device is adapted to project at least one machining etchant fluid onto a surface of a semiconductor workpiece, whereby material is etched from said workpiece surface, wherein said at least one ejector device is oriented with respect to said workpiece surface;

b) a holding device which is adapted to secure said workpiece in said oriented position relative to said ejector device while said workpiece surface is being etched, wherein said holding device comprises a rotating mechanism which is capable of rotating said workpiece is during said jet etching; and c) a delivery system which is adapted to deliver at least one machining etchant fluid to said at least one ejector device.

7. The apparatus of claim 1 or claim 6, wherein said delivery system comprises an injector bar along which an array of nozzles is disposed.

8. The apparatus of claim 1 or claim 6, including a system which captures effluent machining etchant fluid and returns said etchant fluid for reuse.

9. The apparatus of claim 1 or claim 6, wherein said delivery system comprises at least two separate pumps, for delivering machining etchant fluid separately to the central orifice and the annular orifice of the at least one dual nozzle.

10. The apparatus of claim 1 or claim 6, in which the delivery system includes provisions for delivery of the machining etchant fluid in pulsed fashion, rather than continuous flow.

11. The apparatus of claim 1 or claim 6, adapted to etch a workpiece comprising a material selected from the group consisting of a silicon wafer or gallium arsenide or other semiconductor substrate, silicon-on-insulator ("SOT"), $SiO_2$, glass, quartz, pyrex, ceramic, or glass bonded to a substrate, conductor, or insulator.

12. The apparatus of claim 6, wherein said dual nozzle ejector device and said delivery system are adapted to deliver a machining etchant comprising a slurry of solid particulate material in a liquid.

13. The apparatus of claim 12, wherein said slurry is a suspension or dispersion.

14. The apparatus of claim 12, wherein said liquid is a chemical etchant for the material of said workpiece.

15. The apparatus of claim 14, wherein said chemical etchant is a compound selected from the group consisting of KOH, NaOH, HF, HNA (an aqueous solution of about 7 wt % HF, about 30 wt. % $HNO_3$, and about 10 wt. % $CH_3COOH$), TMAH (Tetramethyl Ammonium Hydroxide), EDP (Ethylene Diamine Pyrochatechol), and amine gallates.

16. The apparatus of claim 12, wherein said liquid is not a chemical etchant for said workpiece material, but acts as a solvent for a compound which is a chemical etchant for said workpiece material.

17. The apparatus of claim 1 or claim 6, wherein said ejector device and said delivery system are adapted to deliver a machining etchant comprising solid particulate material in a carrier gas stream.

* * * * *

UNITED STATES PATENT AND TRADEMARK OFFICE
CERTIFICATE OF CORRECTION

PATENT NO. : 6,699,356 B2  
DATED : March 2, 2004  
INVENTOR(S) : Robert Z. Bachrach and Jeffrey D. Chinn It is certified that error appears in the above-identified patent and that said Letters Patent is hereby corrected as shown below:

Column 9,  
Line 44, after "ejector", please delete "device." and insert -- device, wherein said ejector devices comprise at least one dual nozzle, in which a central orifice for discharge of machining etchant is surrounded by an outer, annular orifice throuh which machining etchant is also discharged. --.

Column 10,  
Line 16, after "piece", please delete "is".  
Line 37, after "silicon-on-insulator", please delete "("SOT")" and insert -- ("SOI") --.

Signed and Sealed this

First Day of June, 2004

JON W. DUDAS  
*Acting Director of the United States Patent and Trademark Office*